(12) United States Patent
Letor

(10) Patent No.: US 11,133,667 B2
(45) Date of Patent: Sep. 28, 2021

(54) PROTECTION CIRCUIT, CORRESPONDING SYSTEM AND METHOD

(71) Applicant: STMicroelectronics S.r.l., Agrate Brianza (IT)

(72) Inventor: Romeo Letor, Mascalucia (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 33 days.

(21) Appl. No.: 16/790,888

(22) Filed: Feb. 14, 2020

(65) Prior Publication Data

US 2020/0266623 A1 Aug. 20, 2020

(30) Foreign Application Priority Data

Feb. 18, 2019 (IT) .......................... 102019000002297

(51) Int. Cl.
*H02H 9/02* (2006.01)
*H02H 1/00* (2006.01)

(52) U.S. Cl.
CPC .......... *H02H 9/025* (2013.01); *H02H 1/0007* (2013.01)

(58) Field of Classification Search
CPC ........ H02H 3/305; H02H 3/32; H02H 1/0007; H02H 3/08; H02H 9/025
See application file for complete search history.

(56) References Cited

U.S. PATENT DOCUMENTS

| 6,373,671 | B1* | 4/2002 | Watanabe | .......... H03K 17/0822 |
| | | | | 361/103 |
| 7,813,096 | B2* | 10/2010 | Takahashi | ............ H03K 17/687 |
| | | | | 361/93.1 |
| 10,566,781 | B2* | 2/2020 | Wang | ..................... H02H 3/202 |
| 11,005,253 | B2* | 5/2021 | Donath | ................ H02H 3/0935 |
| 2014/0347774 | A1* | 11/2014 | Uehara | ................ H02H 3/0935 |
| | | | | 361/87 |
| 2016/0172841 | A1 | 6/2016 | Lee et al. | |
| 2017/0294774 | A1 | 10/2017 | Illing et al. | |
| 2018/0294643 | A1 | 10/2018 | Donath | |

OTHER PUBLICATIONS

IT Search Report and Written Opinion for IT Appl. No. 102019000002297 dated Oct. 21, 2019 (7 pages).

* cited by examiner

*Primary Examiner* — Jared Fureman
*Assistant Examiner* — Nicolas Bellido
(74) *Attorney, Agent, or Firm* — Crowe & Dunlevy

(57) ABSTRACT

A protection circuit for an automotive wiring harness includes an input node receiving a sensing signal indicating intensity of current in a conductor, an output node emitting a current control output signal to reduce the current and/or emitting a warning signal indicating the current intensity having reached a limit value. Signal processing circuitry coupled to the input node compares the current intensity with a reference value, and produces a comparison signal indicating whether the current intensity exceeds the reference value. A counting circuitry driven by the comparison signal counts in a first count direction as a result of the comparison signal indicating that the current intensity exceeds the reference value. Latching circuitry coupled to the counter circuitry generates the output signal at the output node as a result of the count value of the counter circuitry reaching a limit value.

21 Claims, 10 Drawing Sheets

PROTECTION CIRCUIT, CORRESPONDING SYSTEM AND METHOD

PRIORITY CLAIM

This application claims the priority benefit of Italian Application for Patent No. 102019000002297, filed on Feb. 18, 2019, the content of which is hereby incorporated by reference in its entirety to the maximum extent allowable by law.

TECHNICAL FIELD

The description relates to protection circuits. One or more embodiments may apply to the protection of automotive wiring harnesses against overload and/or short-circuit events.

BACKGROUND

Protection of automotive wiring harnesses against overload and/or short circuit events can be facilitated by fuses included in power distribution harness.

Such an approach appears increasingly unable to satisfy requirements of present-day vehicles and, more to the point, of next generation vehicles equipped for autonomous driving.

Increased fault tolerance and high-level safety are desirable features of inherently complex and redundant power distribution architectures associated with these applications. Arrangements involving resettable and dedicated electronics may be likewise desirable.

As an alternative to conventional melting fuses, electrical systems such as automotive wiring harnesses can be protected against overload and/or short circuit events by controlling the temperature-over-time budget related to generation of heat via the Joule effect.

Such an approach may involve using electronic circuitry capable of estimating the temperature of a wire and deciding to interrupt (or at least reduce) the current flowing through the wire when the temperature-over-time budget exceeds a certain limit value.

Protection of wiring harnesses may involve limiting wire temperature below "guard" levels compatible with a desired level of reliability. Wire temperature can be estimated based on a simplified electro-thermal model. A latching condition (current interruption) can be correspondingly defined, for instance as a result of an increase in the wire temperature $\Delta T_{WIRE}(t)$ in excess of a certain threshold $\Delta T_{MAX}$.

A simplified electro-thermal model for a wire may involve evaluating the thermal power generated via the Joule effect, $P_{JOULE\ EFFECT}(t)$ as:

$$P_{JOULE\ EFFECT}(t) = R_{WIRE}(T_{WIRE}) * I_{WIRE}(t)^2$$

where $R_{WIRE}$ is the electrical resistance of the wire (which in turn is a function of the wire temperature $T_{WIRE}$) and $I_{WIRE}$ is the current flowing through the wire.

Such a thermal model may take into account the fact that the wire may also dissipate thermal power as a result of cooling (by the surrounding air, for instance).

The power dissipated via cooling $P_{COOLING}(t)$ can be expressed as:

$$P_{COOLING}(t) = \Delta T_{WIRE}(t) / RTH_{WIRE}$$

where $\Delta T_{WIRE}(t)$ is the difference of the temperature of the wire $T_{WIRE}$ with respect to the surrounding ambient and $RTH_{WIRE}$ is the associated thermal resistance.

A condition of continuity applied to the thermal power generated by the Joule effect and the power dissipated via cooling leads to the definition of a so-called "adiabatic" power in the form:

$$P_{ADIABATIC}(t) = P_{JOULE\ EFFECT}(t) - P_{COOLING}(t)$$

with the value for $\Delta T_{WIRE}(t)$ adapted to be calculated as:

$$\Delta T_{WIRE}(t) = \left(\frac{1}{CT_{WIRE}}\right) \int_{t0}^{t} P_{ADIABATIC}(t) dt$$

where C denotes the thermal capacity of the wire and $T_{WIRE}$ denotes the temperature of the wire.

Implementation of an (otherwise simplified) thermal model as discussed in the foregoing may involve the implementation of complex circuit performing various operations such as four multiplications, two divisions and one integration over time. Also, at least five reference values or parameters may be involved in such a model which requires memory capability. This may in turn involve a non-volatile memory (NVM) in the case of a digital implementation or a complex analog reference setting circuitry in the case of an analog implementation.

Also, implementing such an approach almost inevitably involves using a microcontroller to convert the value of the wire current measured to digital format and to calculate the wiring temperature in real time by using an equation representing the electro-thermal model of the wire. Integrating such an arrangement on silicon would result in a fairly complex digital circuit such as an embedded micro-controller with a non-volatile memory or a state machine with a non-volatile memory.

To sum up, such an approach would turn out to be expensive both in terms of the semiconductor area occupied and the number of masks involved in the associated manufacturing process.

Also, integrating such circuit in a "smart" power switch would involve taking into account various boundary conditions in terms of electronic components available, semiconductor area occupancy and testability. The feasibility of such an approach would be (strongly) related to the choice of the technology used for integration with a further limitation related to certain technologies being unable to support non-volatile memories.

There is a need in the art to provide improved technology addressing the concerns mentioned above.

SUMMARY

According to one or more embodiments, a protection circuit is provided having the features set forth in the claims.

One or more embodiments may relate to a corresponding system such as, for instance, an embedded wiring harness protection system for use in the automotive sector.

One or more embodiments may relate to a corresponding method.

One or more embodiments may find use in automotive power distribution applications, to provide programmable wiring harness protection, for instance.

One or more embodiments may provide one or more of the following advantages:
  temperature control of harness wires, in terms of $I_{RMS}$ (rms current) limitation, pulsed current timing control, and/or current limitation, for instance;
  capability of adaptation to different loads;

facilitation of operation in latch mode;

ability to operate both in a stand alone and in an assisted mode (e.g., via a microcontroller unit or MCU, for instance), with few standard components involved in integration;

diagnostic capability.

One or more embodiments may provide a flexible control based on two parameters, with the capability of providing a reaction time versus current behavior suited to be fitted easily with wiring IT (current/time) characteristics, such as the current versus time curve currently referred to as an IT curve.

Each point in such an IT curve indicates a longest (maximum) time over which a corresponding current can flow in a certain wire at a given ambient temperature without giving rise to undesired effects. Such curves may be reported in wire datasheets and are mostly dependent on the wire cross-section and max temperature of the insulator.

One or more embodiments may facilitate flexible fitting to an IT curve, which in turn may facilitate the definition of reaction time versus current behaviors compatible with loads exposed to high transient current levels and with a reduced risk of false latch-off due to load inrush current.

One or more embodiments may provide a "smart" fuse with a reduced cost of integration on silicon and programmable reaction time.

One or more embodiments may involve evaluating the $i^2(t)$ (square of the instantaneous current) and $I_{RMS}$ (root-mean-square value of the current) budget associated with a certain wire and act to interrupt current flow with a latch as a result of an $i^2(t)$ and/or $I_{RMS}$ budget reaching certain limits.

In one or more embodiments, two parameters facilitate fitting a reaction time versus current behavior and $I_{RMS}$ behavior to a certain highest (maximum) current versus time characteristic set for a certain wire.

One or more embodiments may achieve these results without complex operations (multiplication, sum, subtraction, integration). This facilitates implementing with a few simple components (fixed references, comparators, standard logics and a digital up/down counter with a fixed clock frequency) a reliable circuit adapted to meet the fault tolerance and safety goals of present-day and next-generation automotive applications.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
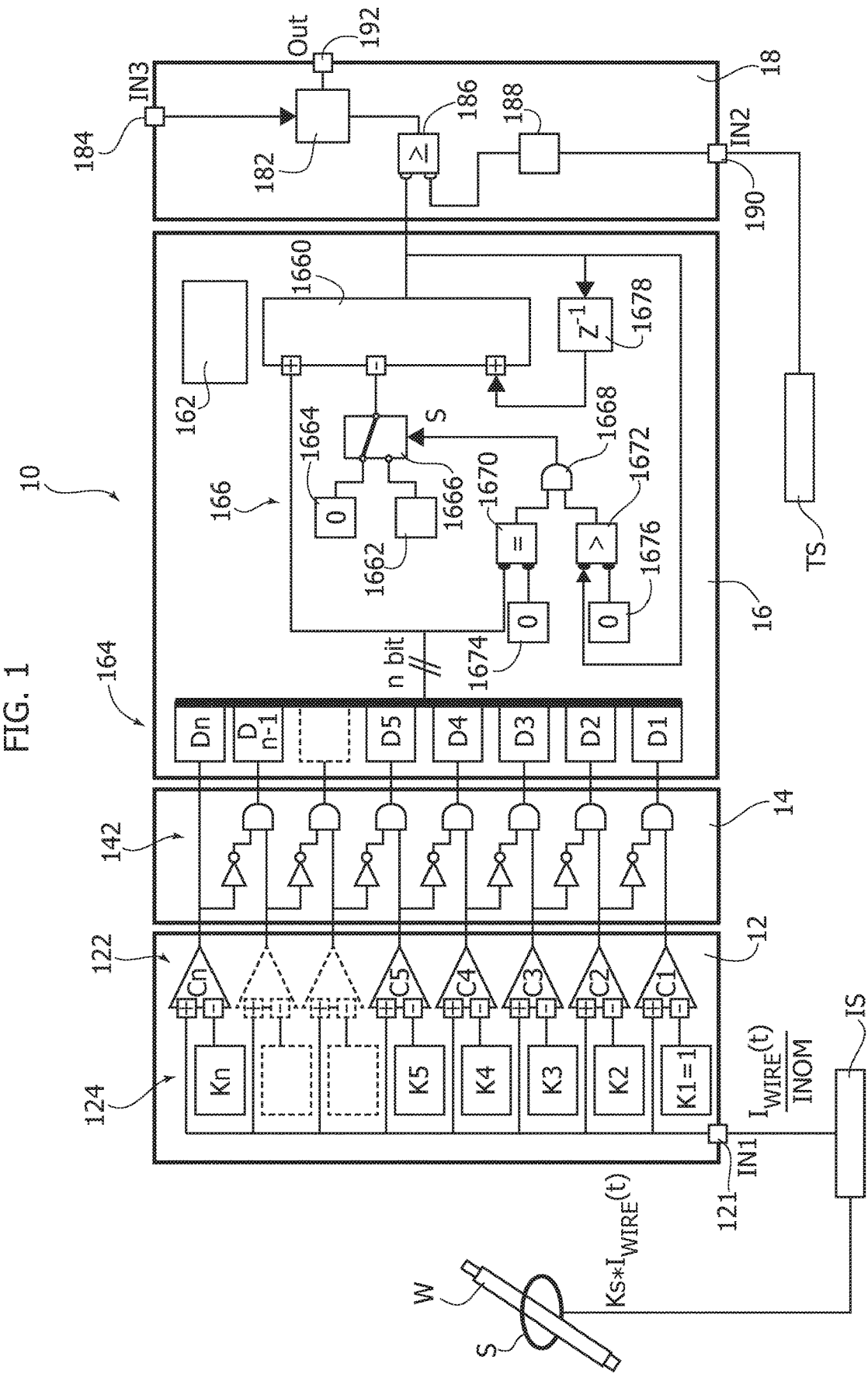
FIG. 1 is a block diagram of a circuit according to embodiments of the present description.

In FIG. 1, reference 10 denotes as a whole a circuit according to one or more embodiments. In the exemplary embodiment exemplified herein, the circuit 10 includes four circuit sections, namely: a comparator circuit section 12, a logic circuit section 14, a section 16 performing scaled counter up/fixed drop down functions, and a latch section 18.

While exemplified as separate sections for the sake of simplicity and ease of description, one or more of the sections 12 to 18 discussed herein may be either integrated to a higher-level circuit sections or subdivided into circuit sub-sections according to desired implementation options. Also, in one or more embodiments, certain elements exemplified herein as parts of the circuit sections 12 to 18 may be implemented as external elements. Similarly, in one or more embodiments, the circuit 10 may include further elements in addition to those exemplified herein.

As exemplified herein, the comparator circuit section 12 may include an input 121 configured to receive an input signal IN1 indicative of the current flowing through a wire W (for instance an automotive wiring harness). The wire may have associated a load L (see FIG. 9) and is intended to be protected against overload and/or short circuit events.

In the diagram of FIG. 1, reference S denotes an amperometric sensor (of any type) configured to generate a sensing signal $Ks*I_{WIRE}(t)$ indicative of the intensity $I_{WIRE}(t)$ of the current flowing through the wire W.

As exemplified in FIG. 1, the sensor S can be coupled to a setting circuit block IS active between the sensor S and the input 121 so that a normalized value for the current through the wire W, namely $I_{WIRE}(t)/INOM$ may be applied to the input 121.

In one or more embodiments, the value for INOM can thus be set (selectively, for instance) at a nominal value for the current $I_{WIRE}(t)$.

In that way, the circuit 10 may be configured to operate as a sort of "universal" fuse adapted to latch (that is interrupt or at least reduce) the current through the wire W as a result of current being found to reach a safety threshold defined as a function of a (first) setting parameter represented by INOM.

It will be appreciated that both the sensor S and the circuit block IS for setting the nominal value INOM for the current may be distinct elements from the embodiments.

In one or more embodiments, the comparator circuit section 12 may include a bank of comparators C1, ..., Cn (collectively indicated as 122) configured to compare the (normalized) current value $I_{WIRE}(t)$/INOM with respective comparison levels or thresholds K1, ..., Kn which may be calculated as discussed in the following and stored in respective registers in a bank of registers indicated collectively as 124.

For instance, the thresholds K1, ..., Kn can be set in such a way to produce a correspondence between the number of thresholds and the number of bits associated with a bank of D registers 164 as discussed in the following.

In one or more embodiments, the value for K1 can be set by convention to unity (K1=Kref*KT=1, where KT is a constant defined such that Kref=1/KT corresponds to the maximum DC current INOM permissible to flow through the wire) by referring to a normalized current $I_{WIRE}(t)$/INOM.

Also, normalization may be effected with reference to KT*$I_{WIRE}(t)$/INOM with KT≠1 and the K values correspondingly set as (1*KT, K2*KT, Kn*KT). This implementation can be advantageous when the reference are analog values (voltage), so that a highest (maximum) value can be set for Kn*KT which is compatible with the highest analog value that can be fixed in the associated IC: for instance Kn*KT<5 if the maximum allowed reference value is 5.

The logic circuit section 14 may include a combinatorial network comprising a plurality of stages collectively indicated as 142 which sense the respective outputs of the comparators C1, C2, ..., Cn and identify the position of (normalized) current value $I_{WIRE}(t)$/INOM within the (one-dimensional) matrix [K1, K2, ..., Kn] of the reference thresholds 124 so that one of the outputs of the logic circuit section 14 is set to a given value, such as logic_out (I)=1 corresponding to KI−1<$I_{WIRE}(t)$/INOM<KI, with I designating the I-th reference threshold in the matrix [K1, K2, ..., Kn] while the other logic outputs are set to another value, for instance zero.

Setting of the thresholds may occur on the basis of the criteria discussed in the following with reference to FIGS. 4 to 6.

The circuit block 16 operates with a fixed clock frequency provided by a clock circuit block 162 (here exemplified as included in the circuit section 16) and includes an input bank of flip-flops D (collectively indicated as 164) which are driven by respective outputs of the logic circuit block 142.

The output of the flip-flop bank 164 may thus include an n-bit binary word used to drive a (fixed drop) counter 166.

As exemplified herein, the counter 166 performs a cumulative adder function via an adder circuit 1660 and the memory delay ($z^{-1}$) designated 1678. This is a configuration for such digital circuitry where the block 1678 ($z^{-1}$) is a memory for the current cumulative result.

As exemplified herein, the counter 166 is driven:
to count "up" by the word at the output of the flip-flop register 164 (at a "+" input at the top of the block 1660 in FIG. 1), and
to either decrease its count by a fixed drop (as provided by a drop circuit block 1662) or to maintain the current count value (0 drop as exemplified by a block 1664) as a function of the position of a switch 1666 which couples to a negative count input "−" of the adder circuit 1660 either the output of the fixed drop circuit 1662 or the output of the zero drop circuit block 1664.

Operation of the switch 1666 is controlled by an AND logic gate 1668 which in turn receives the outputs of a first equality block 1670 and a "greater than" circuit block 1672.

The first equality block 1670 is sensitive to the output from the flip-flop register 164 and a first zero reference block 1674.

The "greater than" circuit block 1672 is in turn sensitive to the input from another zero reference block 1676 and the output from the adder circuit 1660.

As discussed previously, the delay block 1678 ($z^{-1}$) is a memory block that stores the output of the adder 1660 and feeds this value back to the input of the adder, thus implementing a cumulative adder with digital circuitry (essentially as a digital integrator).

Operation of the circuit block 16 as exemplified in FIG. 1 is essentially as follows:
when $I_{WIRE}(t)$/INOM is higher than 1, that is, as a result of $I_{WIRE}(t)$ having reached a threshold value $I_{NOM}$ set via the parameter INOM, the flip-flop corresponding to the I-th D register in the bank 164 is clocked to one so that the value of the register 164 is $2^I$ and the count of the counter 166 is varied in a first direction, e.g., "up", by increasing the count by $2^I$, so that the increase in the count is indicative of "how much" $I_{WIRE}(t)$ is higher than $I_{NOM}$.
if D=0, that is, as a result of $I_{WIRE}(t)$ failing to reach the threshold value represented by $I_{NOM}$, then:
a) if the count of the counter 166 is different from (e.g. higher than) zero, the count of the counter 166 is varied in a second direction, e.g. "down", with the counter 166 decreasing at each clock pulse from the clock 162 of a constant value (fixed drop), that is by the fixed value set by the circuit block 1662 until the count value of the counter 166 reaches zero,
b) if the count of the counter 166 is (already) at zero the output from the counter 166 can be assumed to be NOP (No OPeration).

Those of skill in the art will appreciate that "up" and "down" as exemplified herein for the opposite counting directions for the counter 166 do not represent per se a mandatory choice insofar as one or more embodiments may adopt, mutatis mutandis, a complementary choice.

The latch circuit section 18 as exemplified in FIG. 1 includes a latch circuit 182 which can be reset via an input 184 (IN3) and which is sensitive via a comparison circuit block 186 (a "higher of equal" comparison circuit, for instance) to the output from the counter 166 in the circuit block 16 and to a limit value (for instance an upper or maximum counter value Counter_MAX) as provided by a circuit block 188. The circuit block is in turn coupled to an input 190 (labelled IN2) configured to receive a (time) setting value TNOM from a setting block TS.

The value for TNOM can thus be set (selectively, for instance) at a nominal value corresponding to a desired time for the latch circuit section 18 to latch when a certain constant current (K2.$I_{NOM}$, by way of non-limiting example) is sensed to flow through the wire W. The circuit 10 may thus be configured to operate as a sort of adjustable slow-blow/fast-blow fuse whose time of intervention can be selectively adjusted.

It will be again appreciated that, as is the case for the circuit block IS for setting the nominal value INOM for the current, the setting block TS for TNOM, may be a distinct block from the embodiments.

As exemplified herein, the setting block IS will fix the value of Counter_MAX=TNOM*Clock frequency.

This can be implemented with circuitry (e.g., look-up table or SPI register or A/D, and so on . . . ) suited to the embodiments.

A latch circuit section 18 as exemplified herein will latch its output signal Out (at a node indicated as 192 in FIG. 1) to a certain logic value ("1" for instance) as result of the value of the counter 166 reaching a limit value (the upper value Counter_MAX set via the block 188, for instance) determined as a function of the setting signal TNOM received at the input 190.

In one or more embodiments, the value for the limit value Counter_MAX (an upper or maximum value will be considered herein for simplicity) can be set based on the relationship:

Counter_MAX=TNOM*clock frequency.

where clock frequency designates the frequency of the clock 162 which, while represented as included in the circuit block 16, may be configured to clock operation of the whole circuit 10.

As indicated, the counter 166 may be scaled to $2^I$ so that a time matrix can be found to correspond to the matrix for the "K" values in the comparator circuit section 12 so that:

$$T_{NOM}*[\infty,2^0,2^1,2^2\ldots,2^{n-2})],I_{NOM}(K1,K2,K3,\ldots,Kn)$$

where $T_{NOM}*2^{(I-2)}$ may be held to correspond to the time to latch when a constant current $I_{NOM}*KI$ is sensed to flow through the wire W.

The notation above takes into account the shift in the K indexes, with K1 becoming K2 and so on. Also the nominal time is held to correspond to the first step. After the shift, the first step is K2 and the value 1=K1 is associated to T=∞

The elements in such a matrix can be regarded as defining a reaction time v. current curve which can be approximated by N steps as discussed in the following in connection with FIG. 4.

Figure 2A:
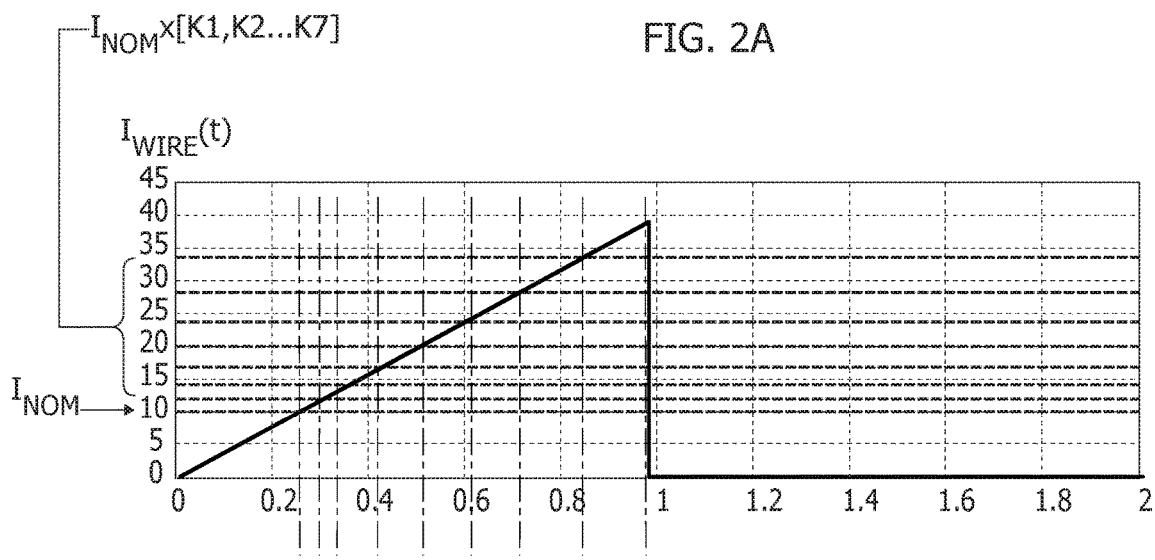
FIGS. 2A, 2B and FIGS. 3A, 3B exemplify possible behaviors of embodiments of the present description in the presence of a current varying continuously over time (FIGS. 2A and 2B) and in the presence of a pulsed current (FIGS. 3A and 3B), respectively.
Figure 2B:
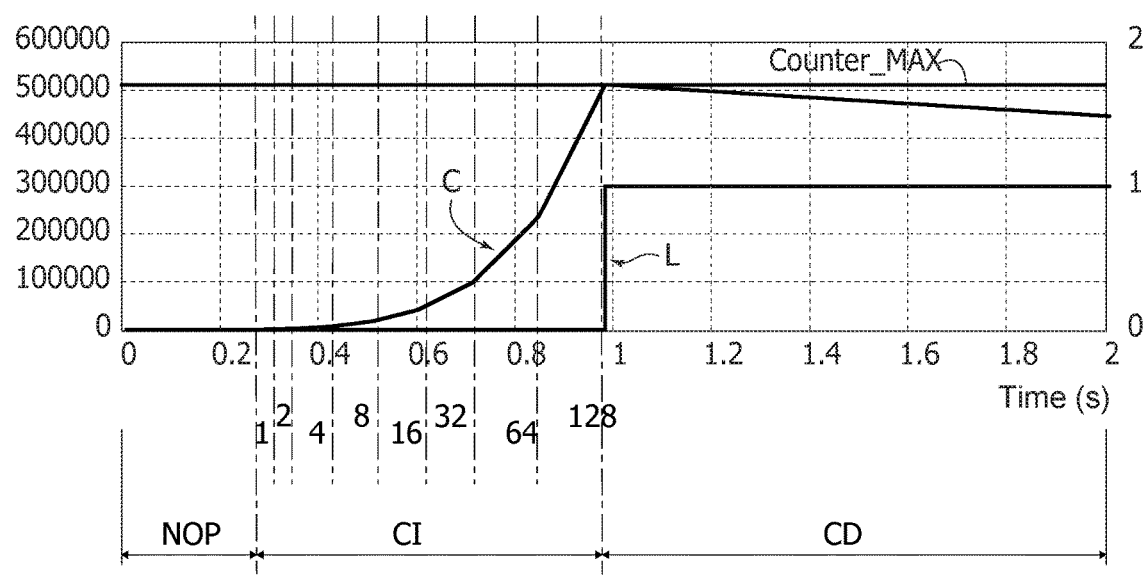

The diagrams of FIGS. 2A and 2B are exemplary of the possible behavior of a circuit as exemplified in FIG. 1 by assuming that the current flowing through the wire W increases ramp-like (triangular wave) as exemplified in the left-hand portion of FIG. 2A by increasing from zero to the nominal value $I_{NOM}$ and on through the various thresholds INOM*[K1, K2, . . . ] up to a limit value (peak level) at which the latch section 18 is activated in order to interrupt (or at least reduce) the current $I_{WIRE}(t)$. This may occur via the intervention of a power switch as discussed in the following in connection with the FIG. 9.

The diagram of FIG. 2B is exemplary of the corresponding time behavior of the count value C of the counter 166, with the count value C increasing as the current $I_{WIRE}(t)$ increases until the (upper) limit value Counter_MAX=TNOM*clock frequency is reached at which the latch circuit section 18 intervenes as indicated by L in FIG. 2B.

Operation of a circuit as exemplified in FIG. 1 in the case of a current $I_{WIRE}(t)$ varying with continuity over time (sawtooth-like, for instance) involves operation cycles including: a NOP phase (for $I_{WIRE}(t)$ lower than $I_{NOM}$), a counter scaled increase phase CI (until intervention of the latch as indicated at L), and a counter decrease (fixed drop) phase indicated as CD.

Figure 3A:
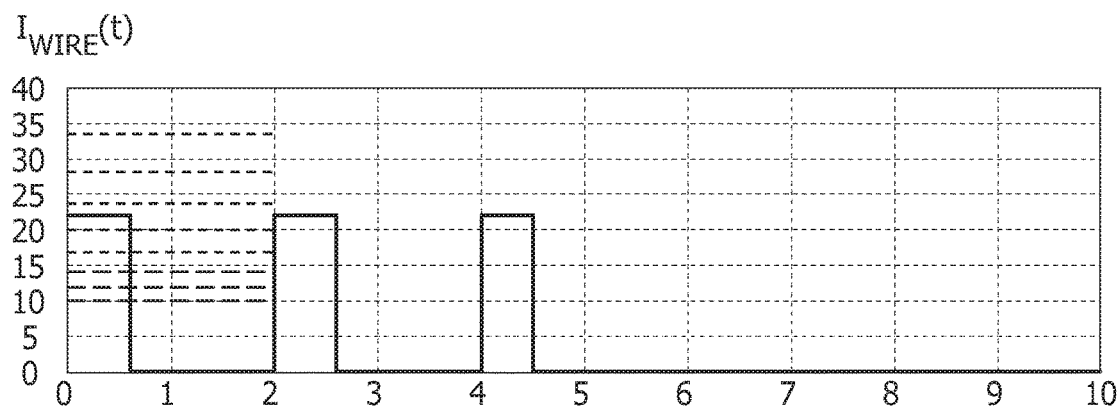
Figure 3B:
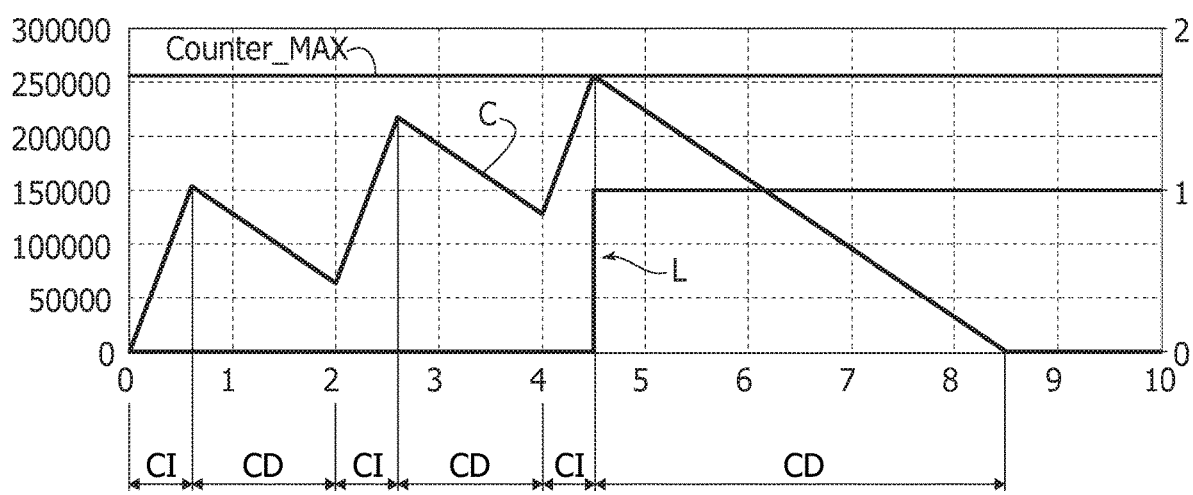

The diagrams of FIGS. 3A and 3B portray an exemplary corresponding behavior of a circuit as 10 in the case of a pulsed current $I_{WIRE}(t)$ with a such pulsed current switching between a "zero" value (thus lower than $I_{NOM}$) and an upper value lying somewhere in the matrix established by the values K1, K2, . . . .

FIG. 3B highlights that the counting phases of the counter 166 in opposite directions (e.g. "up" CI and "down" CD) may alternate and the latch circuit section 18 intervene at L as result of the count value of the counter 166 reaching the limit value Counter_MAX.

Figure 4:
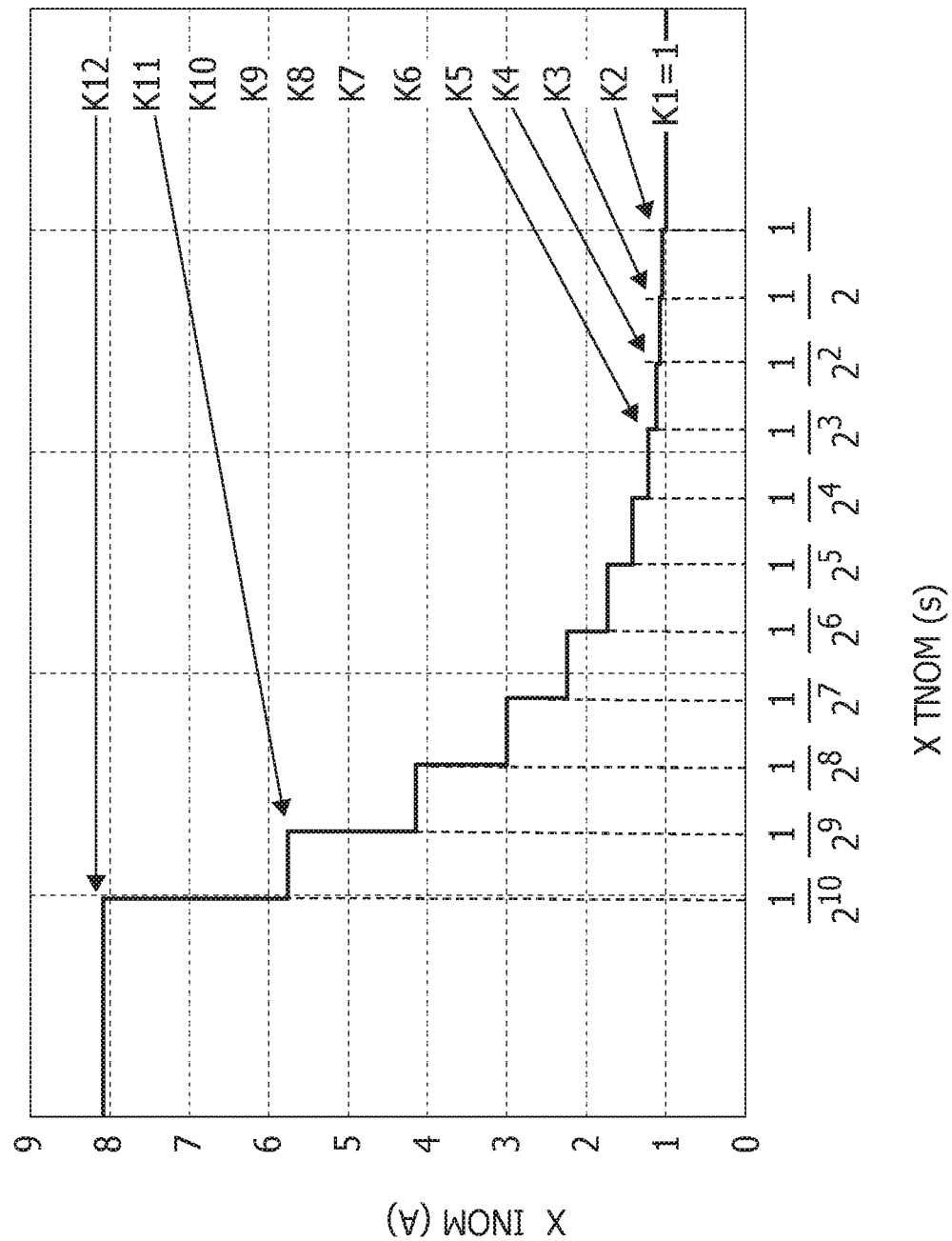
FIGS. 4, 5 and 6 are diagrams exemplary of criteria underlying embodiments of the present description.

The diagram of FIG. 4 is exemplary of the possibility of intervening on the "time axis"/"current axis" matrix namely $T_{NOM}*[\infty,2^0,2^1,2^2\ldots,2^{n-2}],I_{NOM}(K1,K2,K3,\ldots,Kn)$ in order to generate a notionally infinite number of current/time (IT) curves by setting the two parameters INOM (circuit block IS and input 121 in FIG. 1) and TNOM (input circuit block TS an input 190 in FIG. 1).

By acting on the value of the thresholds KI (which may be assumed to be identical for simplicity, but may even be selected to be different to pursue an even finer matching) such IT curves can be caused to fit with the characteristics of a certain wire W to be protected (e.g. a wiring harness). Such characteristics are currently found to exhibit a sort of hyperbole-like behaviour (as exemplified in FIG. 5), which lends itself to be fitted by a $½^I$ (I=0, 1, 2, . . . ) behavior of the relationship which may link INOM and TNOM in a circuit such as the circuit 10 of FIG. 1.

The current and time values in the curve may define a current amplitude and a pulse duration which may lead the temperature of the wire to reach a specified limit (maximum) temperature.

In that respect it will be appreciated that while a "wire" is referred to for the sake of simplicity throughout this description, the wire W can be regarded as exemplary of any electrical component configured to be traversed by a certain current ($I_{WIRE}(t)$ being exemplary of such a current) and intended to be protected.

Figure 5:
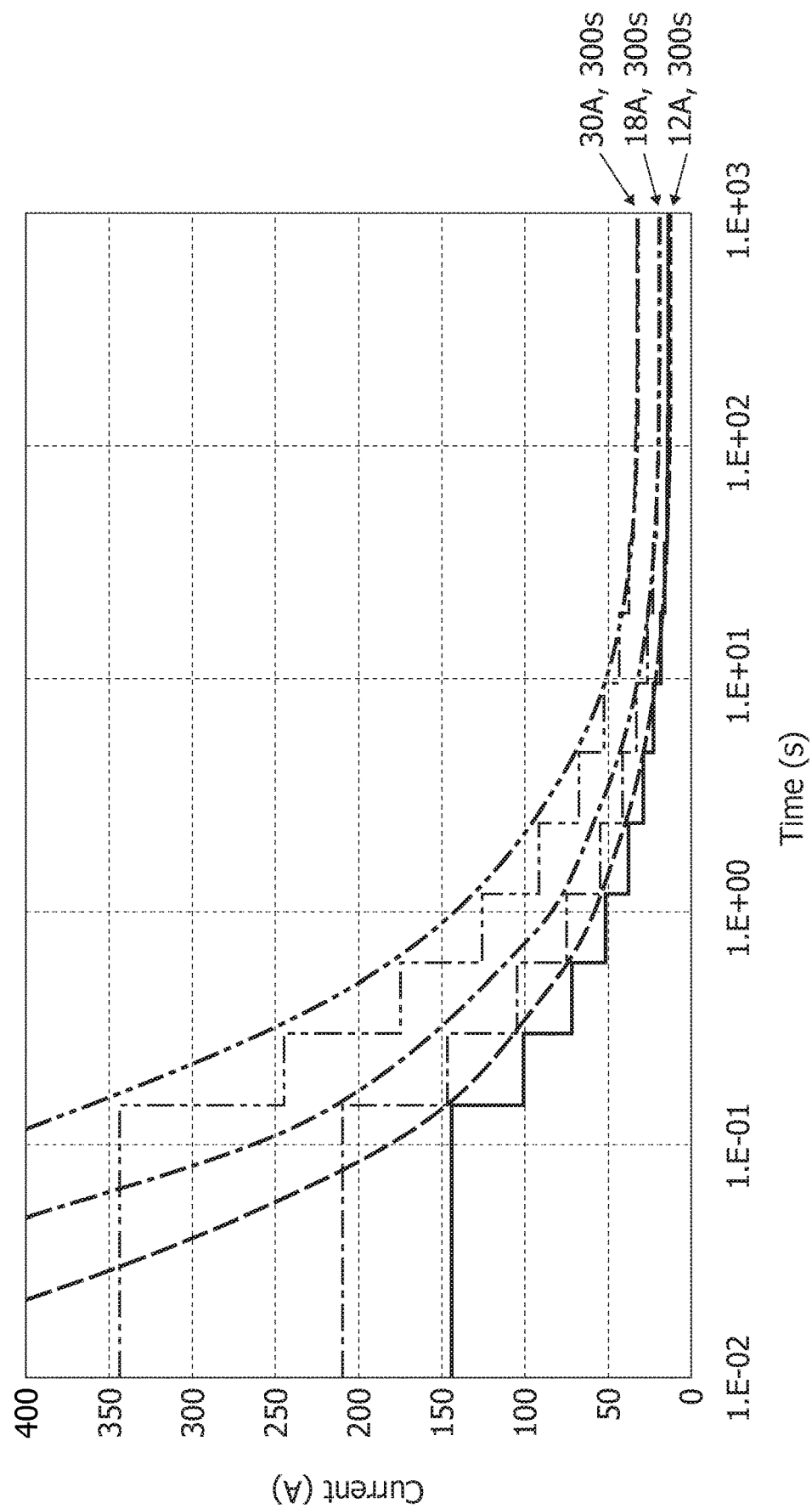

For instance, as exemplified in FIG. 5, the IT response of a circuit as the circuit 10 can be fitted to a desired behavior by setting a value for INOM with reference to a highest (maximum) DC current rate.

By way of example the diagram of FIG. 5 refers to three possibilities: 12A (dashed line), 18A (chain line), and 30A (double dotted chain line).

These values may correspond, for instance, to wire section areas corresponding to 0.5 mm², 1.0 mm² and 2.5 mm².

Of course, the values indicated are merely exemplary and non-limiting for the embodiments.

For instance these IT curves may be rated at a maximum wire temperature of 150° C. (and an ambient temperature of 85° C. maximum) so that the value for INOM may be caused to correspond to a highest (acceptable) current root mean square (rms) value $I_{RMS}$ with all the IT values of the circuit 10 adapted to be automatically fitted to the wire IT curve and the time of intervention of the latch circuit section 18 correspondingly adjusted (by setting TNOM) to be gradually reduced as the value of the current decreases (from right to left in the diagram of FIG. 5) to increasingly higher values with respect to the "asymptotic" value possibly related to long times such as 300 s.

Of course, the indicated figure of 300 s as the time corresponding to the first step is merely by way of example. That value can change in a manner coordinated with the constant value used for the fixed drop (count down) operation of the counter 166. For instance, 300 s may be a value fitting with a certain cable when the fixed drop is set, for instance to 16. If the value of fixed drop is changed, fitting will still be possible by fixing a different time value.

Figure 6:
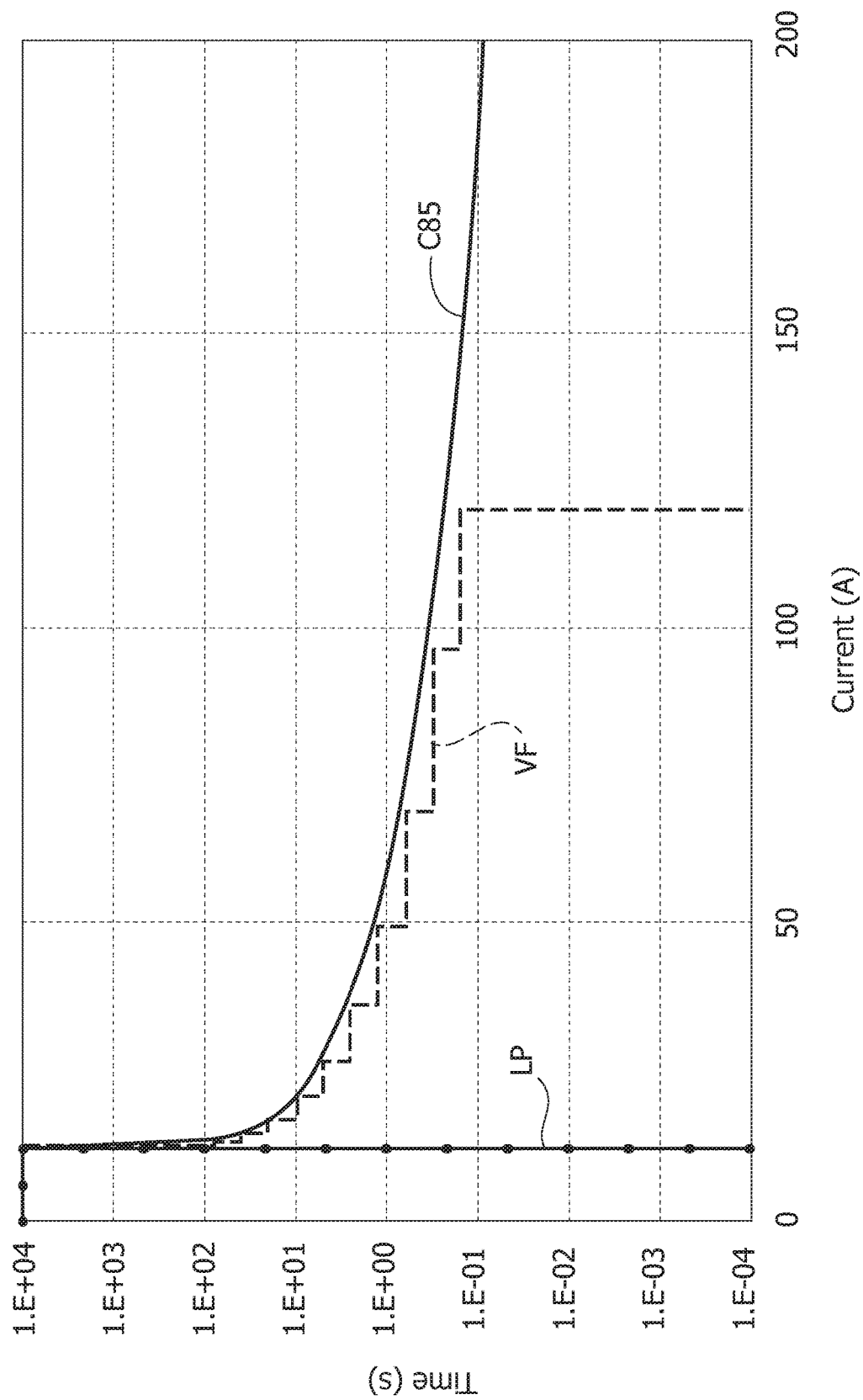

FIG. 6 is exemplary of the same concept portrayed in the form of a graph where the time (ordinate scale) is portrayed as a function of current (abscissa scale). The continuous line C85 portrays the behavior of a wire W at an ambient temperature of 85° C. and the dashed line is exemplary of the behavior of the circuit 10 acting as a "smart" fuse and the chain line is exemplary of the application of a load pulse LP.

The diagram of FIG. 6 refers, by way of example, to an "asymptotic" time of 300 s for INOM=12 A (wire size 0.5 mm² with maximum DC current 12 A) by assuming an initial current equal to zero. Stated otherwise, 300 s may correspond to the first step: INOM*K2 while when $I_{WIRE}$<12 A→T=infinite; the asymptotic timing will thus change with the value of fixed drop changed.

Figure 7A:
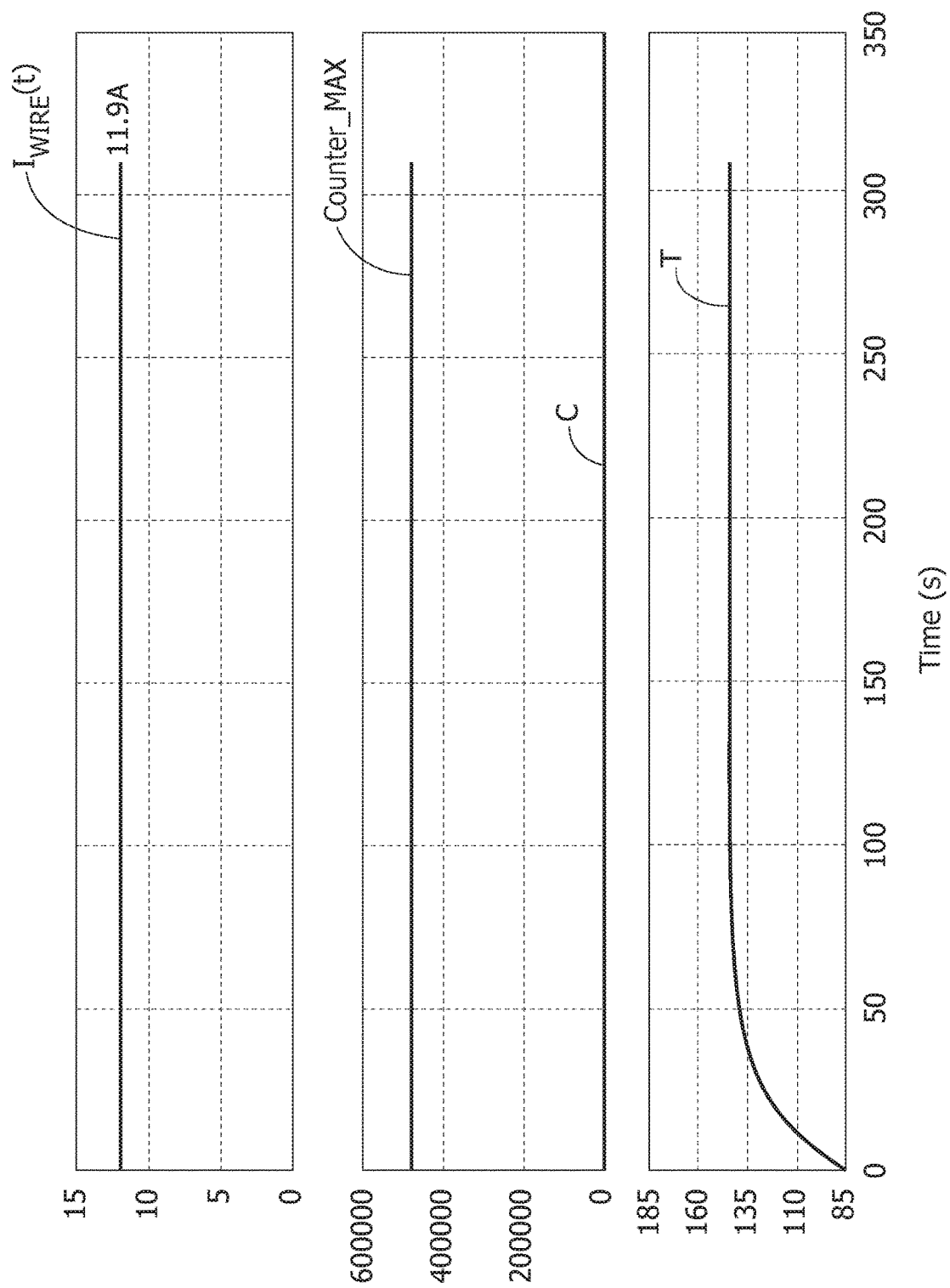
FIGS. 7A and 7B each include three superposed diagrams with a common time scale exemplifying the possible behavior of a circuit according to embodiments of the present description.
Figure 7B:
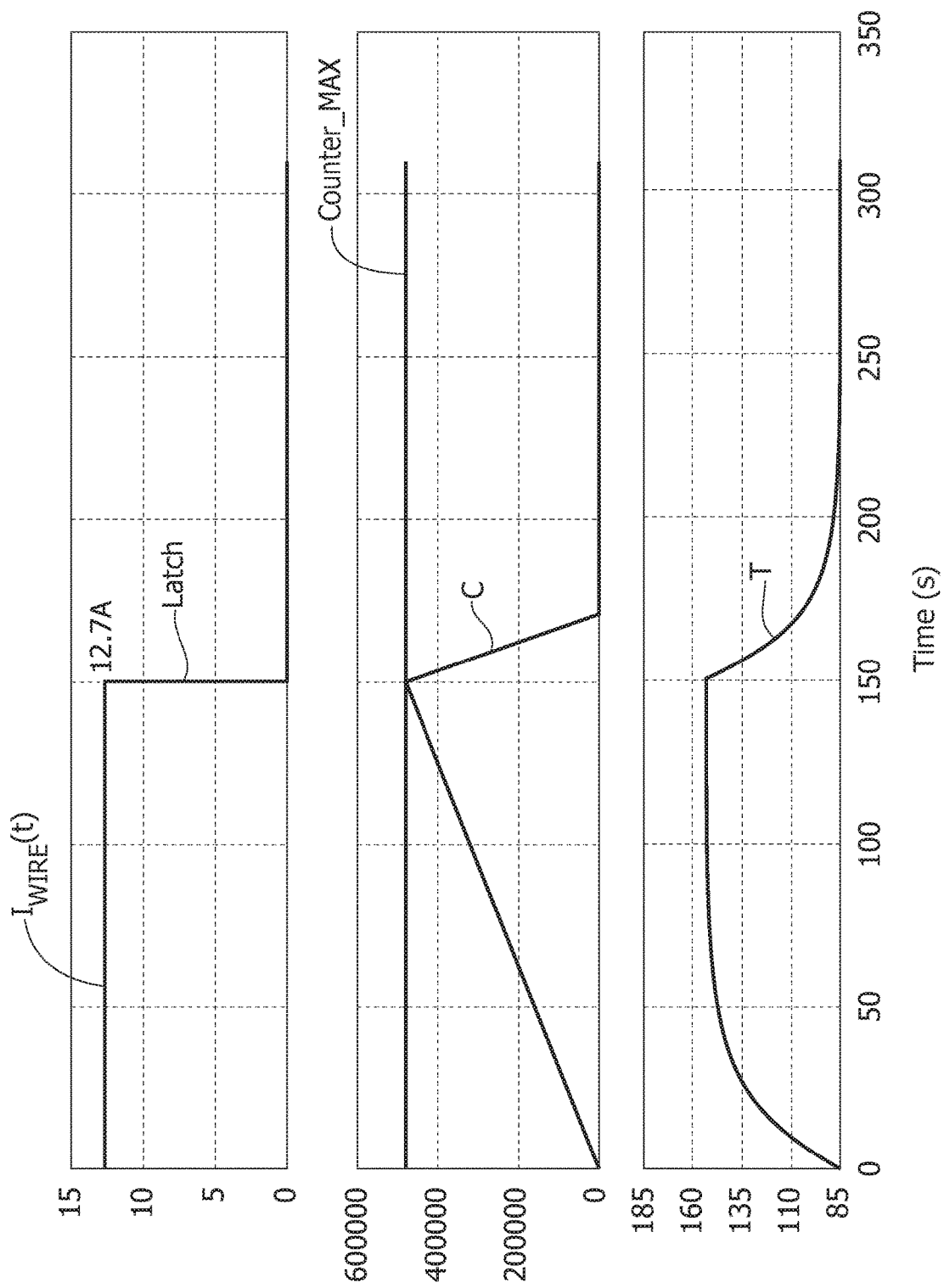

The diagrams of FIGS. 7A and 7B are further exemplary of the behavior of a circuit 10 as exemplified in FIG. 1:
in a case where the current $I_{WIRE}(t)$ does not cause the count value of the counter 166 to reach an upper limit value Counter_MAX (FIG. 7A), and
in a case were the current $I_{WIRE}(t)$ does conversely cause the count value of the counter 166 to reach such a limit value thus causing the latch circuit section 18 to intervene to interrupt the current (FIG. 7B).

In both FIGS. 7A and 7B the upper diagram is exemplary of a possible time behavior of the current $I_{WIRE}(t)$ which in FIG. 7A is held to remain at a "safe" value of, e.g. 11.9 A which is less than a limit of 12.0 A and in FIG. 7B is assumed to reach a value of 12.7 A in excess of the limit of 12 A.

Correspondingly, the count value C of the counter 166 remains practically at 0 (and thus does not reach the limit value Counter_MAX in FIG. 7A) while in FIG. 7B the count value increases and reaches the limit value Counter_MAX to eventually decrease after the intervention of the latch.

In FIG. 7A, the wire temperature (° C.) T is shown to remain at a value somewhere between 135° C. and 160° C. held to be acceptable, while in FIG. 7B the wire temperature is shown to rise to a higher level nearer to 160° C. and to drop subsequently as a result of the current being interrupted by the intervention of the latch circuit section.

Once again the numerical values reported in the foregoing are merely exemplary and non-limiting.

Designing a circuit 10 as exemplified in FIG. 1 may involve calculating the values for the thresholds K2 to Kn in the comparator circuit section 12 with the criterion of causing the rms value for the current $I_{WIRE}(t)$ to remain below a specified current value $I_{NOM}$ as set via the parameter INOM.

In the case of a pulsed current (see, for instance, FIGS. 3A and 3B) the counting action of the counter 166 may be subjected to cumulative increase (see especially FIG. 3B) as a result of the counter 166 possibly starting to count from a non-zero value when the pulses have their rising edges. Such a cumulative effect may eventually cause the counter value to reach the value Counter_MAX to produce undesired intervention of the latch.

In one or more embodiments, a maximum value for the duty cycle of a pulsed current can be identified which represents a limit condition before a counter accumulation as exemplified in FIG. 3B sets in. In that way the possibility exists of facilitating scaled up, fixed drop-down operation of the counter 166 in such a way that the counter 166 starts counting (e.g. up) from zero at each rising edge of the pulsed current and returns to zero (e.g. due to fixed drop-down) just before a subsequent pulse.

Figure 8:
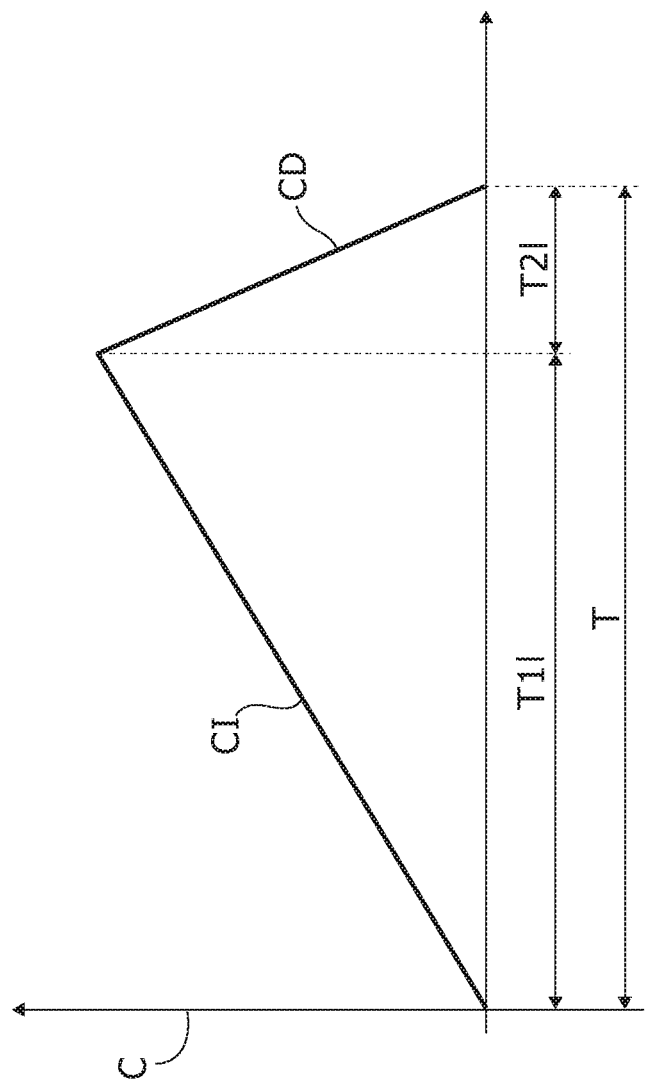
FIG. 8 is a diagram exemplary of criteria which may be applied in embodiments of the present description.

The diagram of FIG. 8 refers to the exemplary case of current pulses including square wave pulses with a period T given by the sum of an "on" time T1I and an "off" time T2I. The diagram of the FIG. 8 is exemplary of the possibility of defining a relationship linking the step counter value I*T1I (with Step Counter I=2$^{(I-2)}$), the parameter INOM and the amplitude INOM*KI of the pulsed current such that the product Step counter I*T1*clock frequency over the on-time T1I (increase phase CI) is compensated by the product Fixed drop*T2I*clock frequency over the off-time T2I (drop phase CD) with Fixed drop set by the block 188 in FIG. 1.

Application of that criteria leads to setting KI (by assuming a uniform distribution within the matrix of the thresholds in the comparator circuit section 12) such that:

$$KI = \frac{1}{\sqrt{MAX\ duty\ cycle}} = \sqrt{\frac{2^{(I-2)} + \text{Fixed Drop}}{\text{Fixed Drop}}}$$

with the values for KI independent from TNOM.

Figure 9:
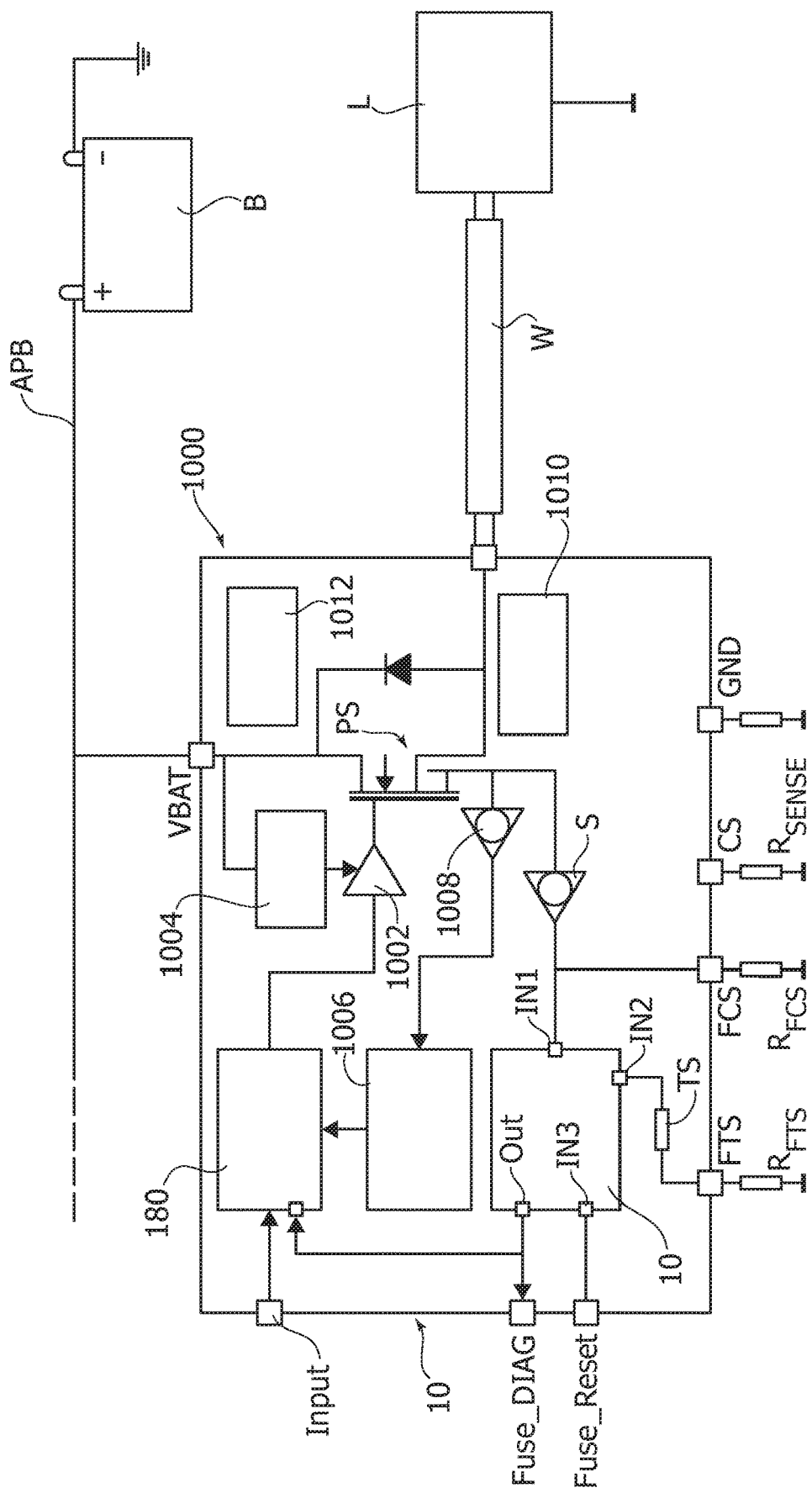
FIG. 9 is a block diagram of a system incorporating a circuit according to embodiments of the present description.

FIG. 9 is exemplary of the possible use of a circuit 10 as exemplified in FIG. 1 within the framework of a system 1000 which facilitates protection of a wiring harness W supplying a load L.

As exemplified in FIG. 9, such a system may include a "smart" power switch and a power supply source (such as an Automotive Power Bus APB) coupled to the positive pole B+ of a battery B at a voltage VBAT.

In one or more embodiments, a system 1000 as exemplified in FIG. 9 may include a power switch PS such as, for instance, a power MOSFET transistor having the current path therethrough (source-drain in the case of a field-effect transistor such as a MOSFET transistor) coupling the power supply VBAT with the wiring harness W and the control terminal of the power transistors PS (gate, in the case of field-effect transistor such as a MOSFET transistor) driven via a (logic) circuitry 180 which is sensitive to a drive signal of the load L as received at a drive node indicated as Input as well the output signal Out at the node 192 of the latch section of the circuit 10.

In FIG. 9 parts or elements like parts or elements already discussed in connection with the previous figures are indicated by like references: a detailed description of these parts or elements will not be repeated for brevity.

The representation of FIG. 9 exemplifies that the control electrode (gate, for instance) of the power transistor PS may be controlled by the circuitry 180 via a control stage 1002 coupled to a VDS clamp circuit block 1004 which is in turn sensitive to the battery voltage VBAT with the ensuing possibility of disconnecting the wiring harness W in the presence of an over-voltage condition over the voltage VBAT.

The representation of FIG. 9 also highlights the possibility for the circuitry 180 to be sensitive to the output of a silicon protection block 1006 which is in turn sensitive via a current sense block 1008 to the current through the power transistor PS (and thus through the wiring harness W).

The same current can be sensed by the sensor S configured to be coupled to the input 121 (IN1) as exemplified in FIG. 1).

The representation in FIG. 9 (which also refers to the possible presence of a charge pump 1010) exemplifies that, in addition to being sent to the circuitry 180 to possibly reduce/interrupt the current through the wire W the output signal Out from the latch section 18 of the circuit 10 can be sent to an output pin Fuse_DIAG, which may be used for diagnostic purposes, e.g. by being set high when the "fuse" 10 is in latch state.

In FIG. 9, F_CTRL denotes a pin available for fuse control, which can be connected to the input node IN3 (node 184 FIG. 1) as a reset pin for the latch.

In FIG. 9, a pin designated FTS is shown connecting a resistance $R_{FTS}$ to ground GND with the purpose of setting the value of TNOM, so that the TS block may contribute to calculating the value of the Counter_MAX value discussed previously as a function of $R_{FTS}$.

In FIG. 9, a pin designated FCS is also shown which may be used to set the value of INOM (see the block IS in FIG. 1).

For instance, in one or more embodiments, the block S may be implemented as a current generator that generates a current $Ks*I_{WIRE}(t)$ proportional to the current $I_{WIRE}(t)$ in the wire W: this may occur, for instance, via a sensfet feature associated to the transistor PS. A resistance $R_{FCS}$ between the pin FCS and ground may be used to set the value for INOM so that, for instance, the voltage at the input node 121 in FIG. 1 (that is, IN1) is equal to 1 when $I_{WIRE}$ equals INOM.

The representation of FIG. 9 also refers to the possible presence of further pins designated CS (a function that may be provided in "smart" power devices) and GND (the ground of the IC of the system 1000). This representation is merely for the sake of completeness, insofar as neither of the pins are of relevance to the instant description.

FIG. 9 is exemplary of one possible, non-limiting application of certain embodiments to a control circuit embedded in an otherwise conventional "smart" power IC. Reference to this possible application is merely exemplary of one of a variety of possible applications which may benefit from the capability of controlling the temperature-over-time budget of a conductor having a current flowing therethrough.

A circuit 10 as exemplified herein may thus be included (embedded, for instance) is a system having a different configuration from the one exemplified in FIG. 9.

For instance, a circuit 10 as exemplified herein may be embedded in a gate driver not including a power switch.

Also, in one or more embodiments, the operating parameters can be set in a manner different form the manner presented herein by way of example. For instance, INOM and/or TNOM can be set via serial bus communication and/or as an alternative to the analog implementation exemplified in FIG. 9, the blocks IS, TS can be implemented as digital circuitry.

Likewise, sensing the current $I_{wire}(t)$ may be via a shunt amperometric arrangement.

Analog-to-digital (A/D) conversion of the current $I_{wire}(t)$ may be facilitate current management in a (wholly) digital manner.

In various possible applications, a circuit 10 as exemplified herein may provide a simple circuit able to evaluate the $I_{RMS}$ (root-mean-square value of the current) flowing in a cable.

A circuit 10 as exemplified herein may be used either to interact with a driver to interrupt a current (when $I_{RMS}$>INOM, for instance), to limit the current flowing in a wire by PWM modulation or just to issue a warning that may be communicated by a diagnostic.

As noted, a circuit 10 as exemplified herein is able to measure the $I_{RMS}$ value insofar as the parameters (thresholds) K2 to Kn can be selected as normalized values of a current defined for normalized values of the timing (1 to $2^{n-2}$).

The values K2 to Kn may be fixed values such that, if multiplied by INOM, may define an IT curve fitting with the wire IT characteristics where the wire IT characteristics are defined for a maximum temperature of the wires with a given ambient temperature, which is facilitated by the fact that K2 to Kn can be calculated for a constant value of $I_{RMS}$.

One or more embodiments as exemplified herein facilitate the $I_{RMS}$ calculation/evaluation by implementing the calculation of the integral of $i^2(t)$ over time (that is $\int i^2(t)dt$) as a simple counter where the incremental value dt is discrete and made variable as a function of the current.

One or more embodiments take advantage of using power of 2 ($2^I$) incremental values as this facilitates a simple implementation of the counter. Determining (calculating) the current thresholds as INOM*(K1, . . . , Kn) facilitates obtaining a counting result which is representative of $I_{RMS}$.

One or more embodiments were found to operate correctly also when the current i(t) is variable with fast transients insofar as a system clock frequency can be selected which is (much) higher (ten time higher, for instance) than the frequency bandwidth of i(t). In that way, the incremental value ($2^I$) is updated many times during a transient. This facilitates achieving a high degree of precision as a function of the resolution of the references INOM*(K1, . . . Kn).

A circuit (for instance, 10) as exemplified herein may comprise:
an input node (for instance, 121) configured to receive a sensing signal (for instance, IN1) indicative of a current intensity (for instance, $I_{WIRE}(t)$) of a current flowing in a conductor (for instance, W),
an output node (for instance, 192) configured to emit an output signal (for instance, Out),
signal processing circuitry (for instance, 12, 14) coupled to the input node to receive the sensing signal therefrom, the signal processing circuitry configured to compare (for instance, 122, 124) said current intensity with a reference value (for instance, INOM) for the current intensity in the conductor and to produce (for instance, 142) a comparison signal (for instance, D1, . . . , Dn) indicative of whether said current intensity exceeds the reference value,
counter circuitry (for instance, 166) coupled to the signal processing circuitry, the counter circuitry driven by the comparison signal and configured to count in a first count direction (for instance, upward) as a result of the comparison signal indicating that said current intensity exceeds the reference value,
latch circuitry (for instance, 18) coupled (for instance at 186) to the counter circuitry, the latch circuitry sensitive to the count value of the counter circuitry and configured, as a result of the count value of the counter circuitry reaching a limit value (for instance, Counter_MAX), to emit said output signal at said output node.

In a circuit as exemplified herein, the output node may be configured to emit a current control output signal (for instance, towards the logic circuitry 180) to reduce (for instance, to interrupt) the current flowing in the conductor and/or a warning output signal (for instance, Fuse_DIAG) indicative of a current intensity value (for instance instantaneous, $I_{WIRE}(t)$, or root-mean-square, $I_{RMS}$) of the current flowing in said conductor having reached a limit value.

In a circuit as exemplified herein, the counter circuitry may be configured to count in a second count direction (for instance, downward), opposite the first count direction, as a result of the comparison signal indicating that said current intensity fails to reach the reference value.

In a circuit as exemplified herein the first and second count directions of the counter circuitry may include increasing and decreasing, respectively, the count value of the counter circuitry, and/or the counter circuitry may be configured to omit counting in the second count direction, opposite the first count direction, in the presence of a zero count value of the counter circuitry.

A circuit as exemplified herein may comprise first parameter setting circuitry (for instance, IS) coupled to the first input node, the first parameter setting circuitry configured to set the reference value for the current intensity in the conductor.

In a circuit as exemplified herein the first parameter setting circuitry may comprise a normalization block configured to supply the first input node with a said sensing signal normalized to said reference value for the current intensity in the conductor.

In a circuit as exemplified herein the signal processing circuitry may comprise a comparator bank (for instance, 122) coupled to the first input node and configured to compare said current intensity with a plurality of thresholds, wherein said comparison signal may comprise a multi-bit binary word, wherein the counter circuitry may be configured to vary its count in the first count direction as a function of said multi-bit binary word.

In a circuit as exemplified herein, the counter circuit may be configured to vary its count in the second count direction in fixed variation steps (for instance, as set by 1662).

In a circuit as exemplified herein, the latch circuitry may comprise second parameter setting circuitry (for instance, TS, 188) configured to set the limit value (for instance, Counter_MAX) for the latch circuitry to emit said current control signal.

In a circuit as exemplified herein, the second parameter setting circuitry may be configured to receive (for instance, 190) a time setting signal (for instance, IN2, TNOM) which is a function of a latch time for the latch circuitry to emit said current control signal for a certain constant current intensity in said conductor and to set the limit value for the latch circuitry to emit said current control signal as a function of said time setting signal.

In a circuit as exemplified, the thresholds in said plurality of thresholds (for instance, K1, . . . Kn) in said comparator bank have values wherein said time setting signal multiplied by $2^{(I-2)}$ equals a latch time for the latch circuitry to emit said current control signal for a constant current intensity in said conductor equal to the product of said reference value and the I-th threshold in said plurality of thresholds in said comparator bank.

A system (for instance, 1000) as exemplified herein for supplying electrical power to a load (for instance, L) via a conductor may comprise:

an electronic switch (for instance, PS) having a control terminal as well as a current path therethrough, the electronic switch configured to be arranged with the current path therethrough between an electrical power supply source (for instance, APB) and said conductor to control current flow between the electrical power supply source and said conductor, a circuit (for instance, 10) as exemplified herein having said input node configured to receive a sensing signal indicative of a current intensity of a current flowing in said conductor and said output node coupled (for instance, via the logic circuit 180) to the control terminal of the electronic switch and configured to apply thereto said current control signal to reduce (for instance, to interrupt) the current flowing in the conductor.

A method of operating a circuit or a system as exemplified herein may comprise:

selecting an upper limit for a DC current intensity in said conductor, and adopting said upper limit for DC current intensity in said conductor as said reference value for the current intensity in the conductor.

Without prejudice to the underlying principles, the details and embodiments may vary, even significantly, with respect to what has been presented herein by way of example only without departing from the scope of protection. The extent of protection is defined by the annexed claims.

The claims are an integral part of the disclosure as provided herein.

The invention claimed is:

1. A circuit, comprising:
   an input node configured to receive a sensing signal indicative of a current intensity of a current flowing in a conductor;
   an output node configured to provide an output signal;
   signal processing circuitry coupled to the input node to receive the sensing signal, the signal processing circuitry configured to compare said current intensity with a reference value for the current intensity in the conductor and produce a comparison signal indicative of whether said current intensity exceeds the reference value;
   counting circuitry coupled to the signal processing circuitry, the counting circuitry driven by the comparison signal and configured to count in a first count direction as a result of the comparison signal indicating that said current intensity exceeds the reference value;
   latch circuitry coupled to the counting circuitry, the latch circuitry sensitive to a count value of the counting circuitry and configured to generate said output signal at said output node as a result of the count value of the counting circuitry reaching a limit value.

2. The circuit of claim 1, wherein the output signal comprises:
   a current control output signal to reduce the current flowing in the conductor and/or a warning output signal indicative of the current intensity of the current flowing in said conductor having reached a limit value.

3. The circuit of claim 1, wherein the counting circuitry is configured to count in a second count direction, opposite the first count direction, as a result of the comparison signal indicating that said current intensity fails to reach the reference value.

4. The circuit of claim 3, wherein:
   the first and second count directions of the counting circuitry include increasing and decreasing, respectively, the count value of the counting circuitry.

5. The circuit of claim 3, wherein:
   the counting circuitry is configured to omit counting in the second count direction, opposite the first count direction, in the presence of a zero count value of the counting circuitry.

6. The circuit of claim 1, comprising first parameter setting circuitry coupled to the input node, the first parameter setting circuitry configured to set the reference value for the current intensity in the conductor.

7. The circuit of claim 6, wherein the first parameter setting circuitry comprises a normalization block configured to supply the input node with said sensing signal normalized to said reference value for the current intensity in the conductor.

8. The circuit of claim 6, wherein the latch circuitry comprises second parameter setting circuitry configured to set the limit value for the latch circuitry to generate said output signal.

9. The circuit of claim 8, wherein the second parameter setting circuitry is configured to receive a time setting signal which is a function of a latch time for the latch circuitry to generate said output signal for a certain constant current intensity in said conductor and to set the limit value for the latch circuitry to generate said output signal as a function of said time setting signal.

10. The circuit of claim 9, wherein the signal processing circuitry comprises a comparator bank coupled to the input node and configured to compare said current intensity with a plurality of thresholds, wherein said comparison signal comprises a multi-bit binary word, wherein the counting circuitry is configured to vary counting in the first count direction as a function of said multi-bit binary word; and wherein the thresholds in said plurality of thresholds in said comparator bank have values wherein said time setting signal multiplied by $2^{(I-2)}$ equals a latch time for the latch circuitry to generate said output signal for a constant current intensity in said conductor equal to a product of said reference value and an I-th threshold in said plurality of thresholds in said comparator bank.

11. The circuit of claim 1, wherein:
the signal processing circuitry comprises a comparator bank coupled to the input node and configured to compare said current intensity with a plurality of thresholds, wherein said comparison signal comprises a multi-bit binary word, wherein the counting circuitry is configured to vary counting in the first count direction as a function of said multi-bit binary word.

12. The circuit of claim 11, wherein the counting circuitry is configured to count in a second count direction, opposite the first count direction, as a result of the comparison signal indicating that said current intensity fails to reach the reference value; and wherein the counting circuitry is configured to vary counting in the second count direction in fixed variation steps.

13. The circuit of claim 1, wherein the reference value for the current intensity is an upper limit for DC current intensity in said conductor.

14. A system for supplying electrical power to a load via a conductor, comprising:
an electronic switch having a control terminal and a current path therethrough, the electronic switch configured to be arranged with the current path therethrough between an electrical power supply source and said conductor to control current flow between the electrical power supply source and said conductor;
an input node configured to receive a sensing signal indicative of a current intensity of a current flowing in a conductor;
an output node coupled to the control terminal of the electronic switch and configured to provide an output signal causing the electronic switch to selectively reduce the current flowing in the conductor;
signal processing circuitry coupled to the input node to receive the sensing signal therefrom, the signal processing circuitry configured to compare said current intensity with a reference value for the current intensity in the conductor and to produce a comparison signal indicative of whether said current intensity exceeds the reference value;
counting circuitry coupled to the signal processing circuitry, the counting circuitry driven by the comparison signal and configured to count in a first count direction as a result of the comparison signal indicating that said current intensity exceeds the reference value; and
latch circuitry coupled to the counting circuitry, the latch circuitry sensitive to a count value of the counting circuitry and configured to generate said output signal at said output node as a result of the count value of the counting circuitry reaching a limit value.

15. The system of claim 14, comprising first parameter setting circuitry coupled to the input node, the first parameter setting circuitry configured to set the reference value for the current intensity in the conductor.

16. The system of claim 15, wherein the latch circuitry comprises second parameter setting circuitry configured to set the limit value for the latch circuitry to generate said output signal.

17. The system of claim 16, wherein the second parameter setting circuitry is configured to receive a time setting signal which is a function of a latch time for the latch circuitry to generate said output signal for a certain constant current intensity in said conductor and to set the limit value for the latch circuitry to generate said output signal as a function of said time setting signal.

18. The system of claim 17, wherein the signal processing circuitry comprises a comparator bank coupled to the input node and configured to compare said current intensity with a plurality of thresholds, wherein said comparison signal comprises a multi-bit binary word, wherein the counting circuitry is configured to vary counting in the first count direction as a function of said multi-bit binary word; and wherein the thresholds in said plurality of thresholds in said comparator bank have values wherein said time setting signal multiplied by $2^{(I-2)}$ equals a latch time for the latch circuitry to generate said output signal for a constant current intensity in said conductor equal to a product of said reference value and an I-th threshold in said plurality of thresholds in said comparator bank.

19. A method, comprising:
comparing an intensity of current flowing in a conductor to a reference value;
counting in a first count direction if the current intensity exceeds the reference value;
counting in a second count direction, opposite the first count direction, as a result of the current intensity failing to reach the reference value; and
generating a control signal for a switch that controls current flow between a power source and the conductor as a function of the count reaching a limit value, using a latch circuit;
wherein the limit value is set as a function of a latch time for the latch circuit to generate the control signal for a given constant current intensity in the conductor.

20. The method of claim 19, wherein the first and second count directions include increasing and decreasing the count, respectively, but if the count is zero then omit counting in the second count direction if the current intensity fails to reach the reference value.

21. The method of claim 19, wherein the reference value comprises a plurality of thresholds, and wherein the counting in the first count direction varies dependent upon the comparison of the intensity of the current to the plurality of thresholds.

* * * * *